United States Patent
Berrian

(10) Patent No.: US 6,580,083 B2
(45) Date of Patent: Jun. 17, 2003

(54) HIGH EFFICIENCY SCANNING IN ION IMPLANTERS

(75) Inventor: Donald W. Berrian, Topsfield, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 147 days.

(21) Appl. No.: 09/855,465

(22) Filed: May 15, 2001

(65) Prior Publication Data

US 2002/0003215 A1 Jan. 10, 2002

Related U.S. Application Data

(60) Provisional application No. 60/204,285, filed on May 15, 2000.

(51) Int. Cl.[7] .............................................. H01J 37/304
(52) U.S. Cl. .................................. 250/492.21; 250/398
(58) Field of Search ........................... 250/492.21, 398, 250/442.11

(56) References Cited

U.S. PATENT DOCUMENTS

| | | | |
|---|---|---|---|
| 4,260,897 A | 4/1981 | Bakker et al. | 250/492 |
| 4,421,988 A | 12/1983 | Robertson et al. | 250/492.2 |
| 4,633,138 A | 12/1986 | Tokiguchi et al. | |
| 4,816,693 A | * 3/1989 | Rathmell | 250/492.21 |
| 4,922,106 A | 5/1990 | Berrian et al. | |
| 4,980,562 A | 12/1990 | Berrian et al. | 250/492.2 |
| 5,981,961 A | 11/1999 | Edwards et al. | 250/492.21 |

FOREIGN PATENT DOCUMENTS

| | | |
|---|---|---|
| EP | 0 398 269 | 11/1990 |
| EP | 0 542 560 | 5/1993 |

* cited by examiner

*Primary Examiner*—Kiet T. Nguyen

(57) ABSTRACT

Ion implantation apparatus includes an ion beam generator for generating an ion beam, a scanner for scanning the ion beam across a workpiece in a first direction, a mechanical translator for translating the workpiece in a second direction so that the ion beam is distributed over the workpiece, and a controller for controlling the translation velocity and beam scan width to limit the time that the ion beam is off the workpiece. In the case of a semiconductor wafer, the translation velocity in the beam scan width are controlled to produce an approximately circular scan pattern.

18 Claims, 5 Drawing Sheets

HIGH EFFICIENCY SCANNING IN ION IMPLANTERS

CROSS REFERENCE TO RELATED APPLICATION

This application claims the benefit of provisional application Ser. No. 60/204,285, filed May 15, 2000, which is hereby incorporated by reference.

FIELD OF THE INVENTION

This invention relates to systems and methods for ion beam scanning of semiconductor wafers and other workpieces and, more particularly, to systems and methods for high efficiency ion beam scanning wherein overscan is limited and dose uniformity is achieved.

BACKGROUND OF THE INVENTION

Ion implantation is a standard technique for introducing conductivity-altering impurities into semiconductor wafers. A desired impurity material is ionized in an ion source, the ions are accelerated to form an ion beam of prescribed energy, and the ion beam is directed at the surface of the wafer. The energetic ions in the beam penetrate into the bulk of the semiconductor material and are embedded into the crystalline lattice of the semiconductor material to form a region of desired conductivity.

Ion implantation systems usually include an ion source for converting a gas or a solid material into a well-defined ion beam. The ion beam is mass analyzed to eliminate undesired ion species, is accelerated to a desired energy and is directed onto a target plane. Most ion implanters use an ion beam that is much smaller than the wafer in both dimensions and distribute the dose from the ion beam across the wafer by scanning the beam electronically, moving the wafer mechanically, or by a combination of beam scanning and wafer movement. Ion implanters which utilize a combination of electronic beam scanning and mechanical wafer movement are disclosed in U.S. Pat. No. 4,922,106 issued May 1, 1990 to Berrian et al and U.S. Pat. No. 4,980,562 issued Dec. 25, 1990 to Berrian et al. These patents describe techniques for scanning and dosimetry control in such systems. The beam efficiency in the disclosed systems is limited by the fact that the ion beam is scanned in a square pattern, whereas the wafer is round. Inefficiency in scanning arises from the fact that the ion beam is directed at the wafer during only a portion of the scan time. Efficiency is also limited by the need to overscan the wafer to reach the Faraday beam sensor and to make the dose uniform at the edges of the wafer.

Another drawback of the prior art scan techniques is that the ion beam may be left at a fixed position on one side of the wafer between electronic scans for variable amounts of time to allow the dose to be varied by changing the amount of time that the beam spends on the wafer. This can be a problem because contaminant beams may be present in addition to the main beam. The contaminant beams follow a different path through the ion optics. If the path of one of the contaminant beams falls on the wafer when the beam is at its fixed position, a concentration of dose is produced by the contaminant beam at that spot on the wafer. This problem can occur in ion implanters that use bipolar deflection to scan the ion beam.

U.S. Pat. No. 4,633,138 issued Dec. 30, 1986 to Tokoguchi et al discloses an ion implanter wherein the width of a beam scan is controlled to approximate the shape of the wafer in response to a width sensor. The wafer speed is controlled to compensate for dose variations which result from different sweep widths. U.S. Pat. No. 4,260,897 issued Apr. 7, 1981 to Bakker et al discloses a technique for ion implantation wherein the beam sweep is controlled to match the shape of the target. Curved sensors on each side of the target detect the ion beam and initiate reversal of the sweep. U.S. Pat. No. 4,421,988 issued Dec. 20, 1983 to Robertson et al discloses a technique for ion beam scanning wherein the scan width is matched to the width of the target wafer by means of a predetermined sequence of scan times.

All of the known prior art scanning techniques have had one or more drawbacks, including limited efficiency and limited applicability. For example, the techniques may be limited to ion implanters which employ two-dimensional electrostatic ion beam scanning. Accordingly, there is a need for improved methods and apparatus for high efficiency scanning in ion implanters.

SUMMARY OF THE INVENTION

The present invention relates to ion implanters wherein the ion beam is scanned electronically in one direction, typically horizontally, and the wafer is translated mechanically in a second direction, typically vertically, to distribute the ion beam over the wafer surface. The speed of mechanical translation is varied so that the wafer is travelling more slowly as the beam is scanned across the center of the wafer where it is wider in the electronic scan direction and faster at the top and bottom where the wafer is narrower in the electronic scan direction. The beam scan width is varied in coordination with wafer translation to maintain uniform dose on the wafer while avoiding wasting the ion beam by scanning the beam off the wafer. Preferably, the electronic scan is such that the ion beam is moving at all times so that contaminants are scanned and do not concentrate at one point on the wafer.

According to a first aspect of the invention, a method is provided for ion implantation of a workpiece. The method comprises the steps of generating an ion beam, scanning the ion beam across a workpiece in a first direction in response to a scan waveform that defines a beam scan width, translating the workpiece in a second direction at a translation velocity relative to the ion beam so that the ion beam is distributed over the workpiece, and controlling the translation velocity and the beam scan width to limit the time that the ion beam is off the workpiece.

According to another aspect of the invention, ion implantation apparatus is provided. The ion implantation apparatus comprises an ion beam generator for generating an ion beam, a scanner for scanning the ion beam across a workpiece in a first direction in response to a scan waveform that defines a beam scan width, a mechanical translator for translating the workpiece in a second direction at a translation velocity relative to the ion beam so that the ion beam is distributed over the workpiece, and a controller for controlling the translation velocity and the beam scan width to limit the time that the ion beam is off the workpiece.

BRIEF DESCRIPTION OF THE DRAWINGS

For a better understanding of the present invention, reference is made to the accompanying drawings, which are incorporated reference and in which.

DETAILED DESCRIPTION

Figure 1:
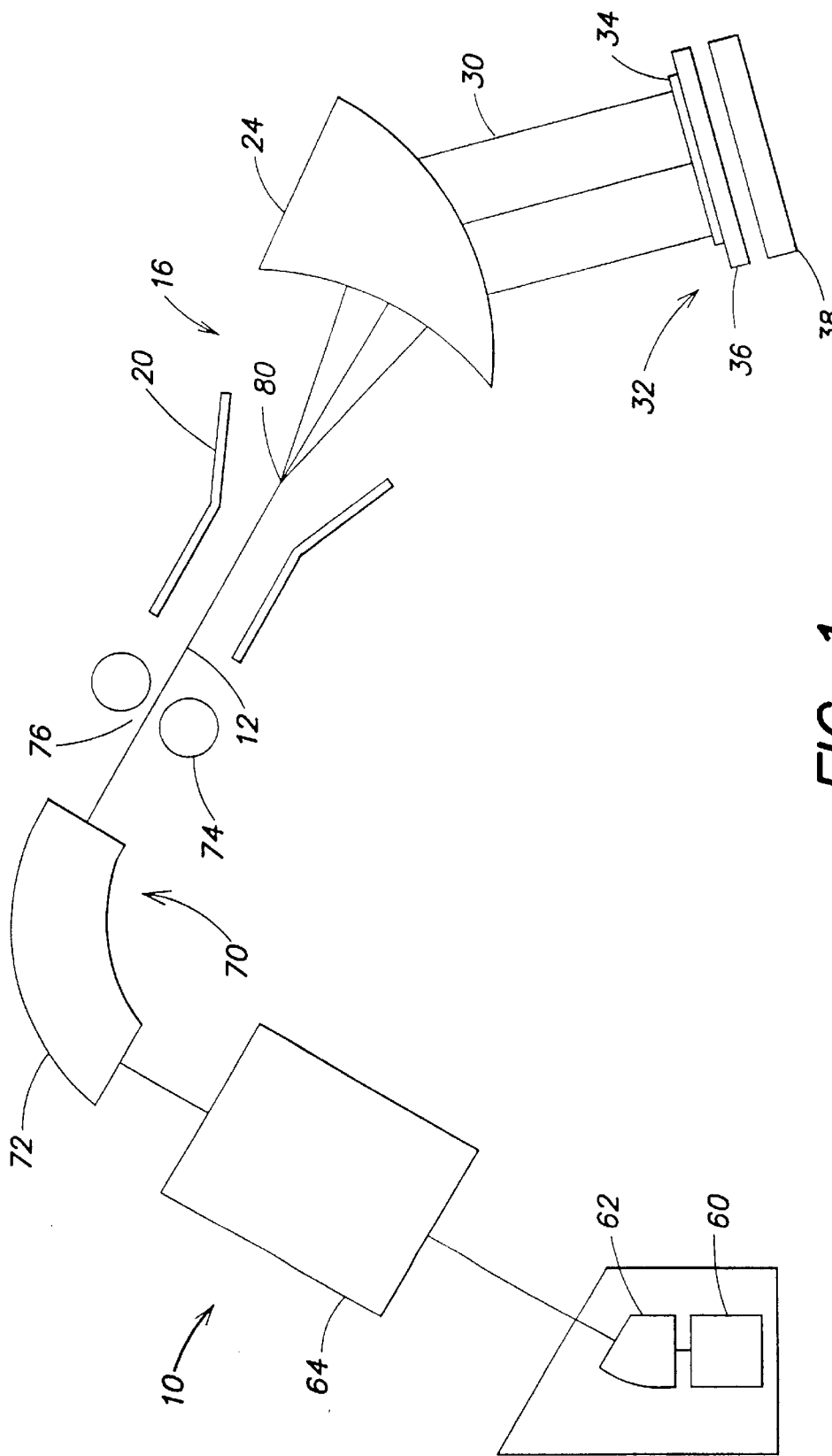
FIG. 1 is a top schematic view of an ion implanter suitable for implementing the present invention.
Figure 2:
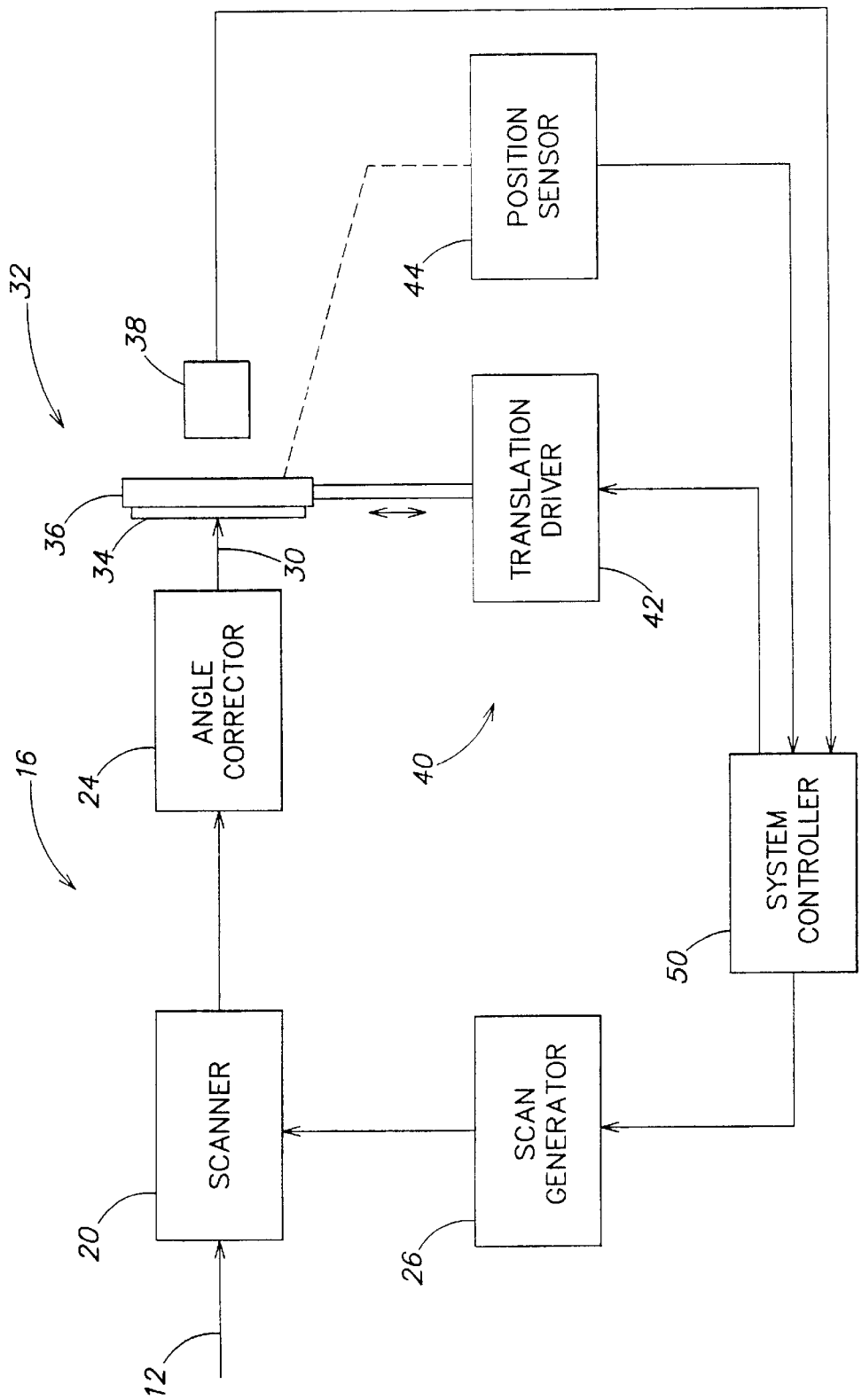
FIG. 2 is a side schematic diagram of the ion implanter of FIG. 1.

Simplified block diagrams of an embodiment of an ion implanter suitable for incorporating the present invention are shown in FIGS. 1 and 2. FIG. 1 is a top view, and FIG. 2 is a side view. Like elements in FIGS. 1 and 2 have the same reference numerals.

An ion beam generator 10 generates an ion beam of a desired species, accelerates ions in the ion beam to desired energies, performs mass/energy analysis of the ion beam to remove energy and mass contaminants and supplies an energetic ion beam 12 having a low level of energy and mass contaminants. A scanning system 16, which includes a scanner 20, an angle corrector 24 and a scan generator 26, deflects the ion beam 12 to produce a scanned ion beam having parallel or nearly parallel ion trajectories.

An end station 32 includes a platen 36 that supports a semiconductor wafer 34 or other workpiece in the path of scanned ion beam 30 such that ions of the desired species are implanted into the semiconductor wafer 34. End station 32 may include a Faraday cup 38 for monitoring ion beam dose and dose uniformity.

As shown in FIG. 2, the ion implanter includes a mechanical translation system 40 for mechanically moving platen 36 and wafer 34 in a vertical direction. The mechanical translation system 40 includes a translation driver 42 mechanically coupled to platen 36 and a position sensor 44 for sensing the vertical position of platen 36. A system controller 50 receives signals from Faraday cup 38 and position sensor 44 and provides control signals to scan generator 26 and translation driver 42. By way of example, system controller 50 may be implemented as a general purpose microprocessor with appropriate memory and other peripheral devices.

The ion beam generator 10 includes an ion beam source 60, a source filter 62, an acceleration/deceleration column 64 and a mass analyzer 70. The source filter 62 is preferably positioned in close proximity to ion beam source 60. The acceleration/deceleration column 64 is positioned between source filter 62 and mass analyzer 70. The mass analyzer 70 includes a dipole analyzing magnet 72 and a mask 74 having a resolving aperture 76.

The scanner 20, which may be an electrostatic scanner, deflects ion beam 12 to produce a scanned ion beam having ion trajectories which diverge from a scan origin 80. The scanner 20 may comprise spaced-apart scan plates connected to scan generator 26. The scan generator 26 applies a scan voltage waveform, such as a triangular waveform, for scanning the ion beam in accordance with the electric field between the scan plates. The ion beam is typically scanned in a horizontal plane.

Angle corrector 24 is designed to deflect ions in the scanned ion beam to produce scanned ion beam 30 having parallel ion trajectories, thus focusing the scanned ion beam. In particular, angle corrector may comprise magnetic polepieces which are spaced-apart to define a gap and a magnet coil which is coupled to a power supply (not shown). The scanned ion beam passes through the gap between the polepieces and is deflected in accordance with the magnetic field in the gap. The magnetic field may be adjusted by varying the current through the magnet coil.

In operation, scanning system 16 scans ion beam 12 across wafer 34 in a horizontal direction, and mechanical translation system 40 translates platen 36 and wafer 34 vertically with respect to scanned ion beam 30. A combination of electronic scanning of ion beam 12 and mechanical translation of wafer 34 causes the ion beam to be distributed over the surface of wafer 34. The ion beam current is measured by Faraday cup 38 when platen 36 is in a lowered position, and a signal representative of ion beam current is supplied to system controller 50. The electronic scan speed can be varied as a function of horizontal beam position to achieve dose uniformity.

Prior art systems typically utilize a constant beam scan width and a predetermined wafer translation to produce a square scan pattern. The dimensions of the square scan pattern included sufficient overscan to ensure dose uniformity at the edges of the wafer. Since the wafer is round, except for any notches or flats, the corners of the square scan pattern are not incident on the wafer and are thereby wasted.

In accordance with an aspect of the invention, the beam scan width and the translation velocity are controlled to provide a beam scan pattern that approximately matches the size and shape of the wafer or other workpiece. In the case of a semiconductor wafer, the scan pattern is substantially circular.

Figure 3B:
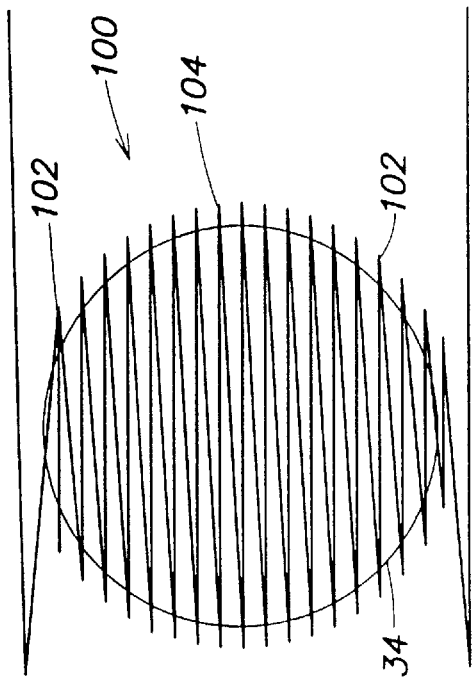
FIG. 3B is a schematic representation of a scan pattern on a wafer in accordance with an embodiment of the invention.

As shown in FIG. 3B, a substantially circular scan pattern 100 can be achieved by providing relatively narrow scan lines 102 near the top and bottom of wafer 34 and relatively wide scan lines 104 near the center of wafer 34, with a gradual variation in scan line width from the bottom of wafer 34 to the center and from the center to the top.

Typically, the electronic scan speed is approximately constant. If the wafer translation velocity is constant and the beam scan width is reduced, dose uniformity is adversely affected, because the ion beam reverses direction earlier, and the scan lines are closer together. In order to achieve a circular scan pattern while maintaining dose uniformity, the vertical translation velocity is varied as a function of beam position on the wafer, as shown by way of example in FIG. 3A. Thus, the translation velocity is relatively high near the top and bottom of wafer 34 and is relatively low near the center of wafer 34. This achieves a scan pattern where the scan lines are nearly evenly spaced over the surface of wafer 34. In particular, the translation velocity is relatively high where the beam scan width is relatively narrow, and the translation velocity is relatively low where the beam scan width is relatively wide. The translation velocity and the beam scan width are coordinated to produce an approximately circular scan pattern and to produce dose uniformity in wafer 34.

Figure 3A:
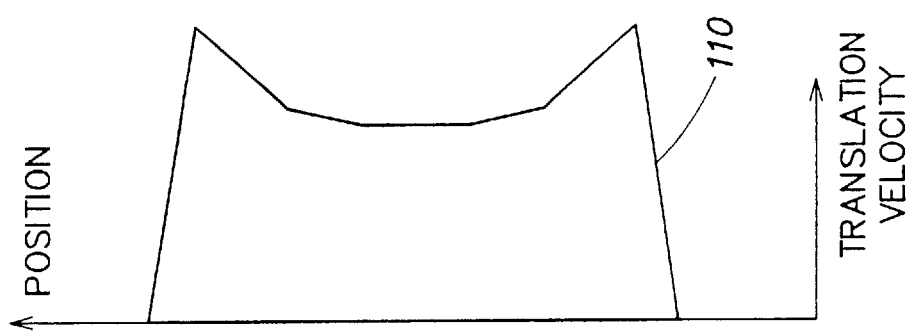
FIG. 3A is a graph of wafer translation velocity as a function of vertical position in accordance with an embodiment of the invention.

The translation velocity and the beam scan width can be coordinated in a number of ways. In one embodiment, the mechanical translation system 40 provides a position pulse to system controller 50 each time the wafer 34 moves vertically by a fixed distance. The system controller 50 commands the scan generator 26 to scan the ion beam across the wafer one time for each position pulse. In this embodiment, each position pulse causes the ion beam to reverse scan direction. This has the effect of making the scan narrower as the wafer moves faster and wider as the wafer moves more slowly. Thus, by triggering each electronic scan line with position pulses and varying the translation velocity, an approximately circular scan pattern is obtained. As shown in FIG. 3A, the translation velocity 110 is higher when the ion beam is incident on the top and bottom of wafer 34 and is lower when the ion beam is incident on the center portion of the wafer. In addition, the scan lines are uniformly distributed on wafer 34 and dose uniformity is achieved. By triggering reversal of scan direction with position pulses, the ion beam is moving at all times, and dose errors produced by contaminant beams are avoided.

The scanning technique described above, wherein electronic beam scans are triggered by position pulses, does not in itself ensure that the scan pattern 100 remains centered on the wafer. Accordingly, the positions where the scan reverses direction may be checked and adjusted relative to the position pulses to ensure centering.

Ion beam scan patterns typically include overscan to ensure dose uniformity at the edges of the wafer. Accordingly, the beam may be scanned completely off the wafer at each edge, resulting in overscan by one-half of the beam diameter at each edge of the wafer. This to approach produces acceptable uniformity but reduces efficiency for the time that the beam is off the wafer. Additional beam efficiency can be obtained by not scanning the ion beam completely off the wafer at the ends of the scan. Without compensation, this approach would cause the dose at the wafer edges to be lower. The reduced dose can be corrected by slowing or stopping the scan briefly at or near the wafer edges to increase the dose. This approach works if the center of the beam is scanned past the edge of the wafer and requires knowledge of the shape of the beam cross-section. A reduction in beam scan width of about one-half the beam diameter along the scan direction may be obtained in this way. This approach is most useful with ion beams that are relatively wide.

Figure 4:
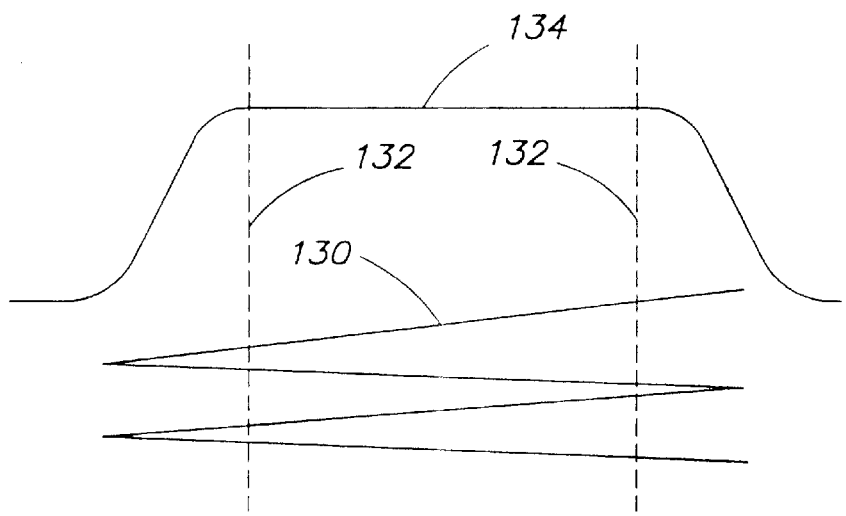
FIG. 4 is a graph of ion dose in the wafer as a function of horizontal position for a triangular scan waveform.
Figure 5:
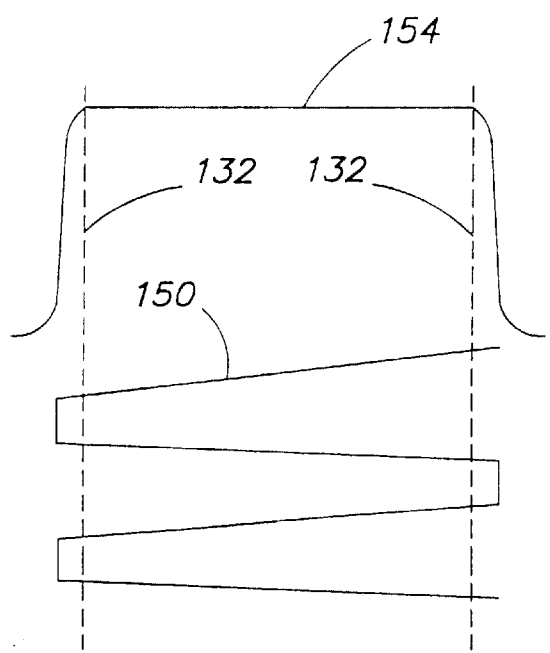
FIG. 5 is a graph of ion dose in the wafer as a function of horizontal position for a scan waveform that slows down or stops near the ends of the scan.

A typical dose distribution with a triangular scan waveform is shown in FIG. 4. The ion beam is scanned past wafer edges 132 by a triangular waveform 130 in order to produce uniform dose distribution 134 on the wafer. The dose distribution at the edges of the scan is the integral of the beam shape. A dose distribution produced by a scan waveform that is slowed or stopped is shown in FIG. 5. A scan waveform 150 produces a dose distribution 154 on the wafer. A scan waveform which includes stopping the beam produces a dose that is the same shape as the beam. The only function which equals its own integral is an exponential function, so the beam can be leveled perfectly only if the beam cross-section has an exponential decay. For other beam shapes, the dose distribution is improved but can not be made perfectly uniform.

Figure 6:
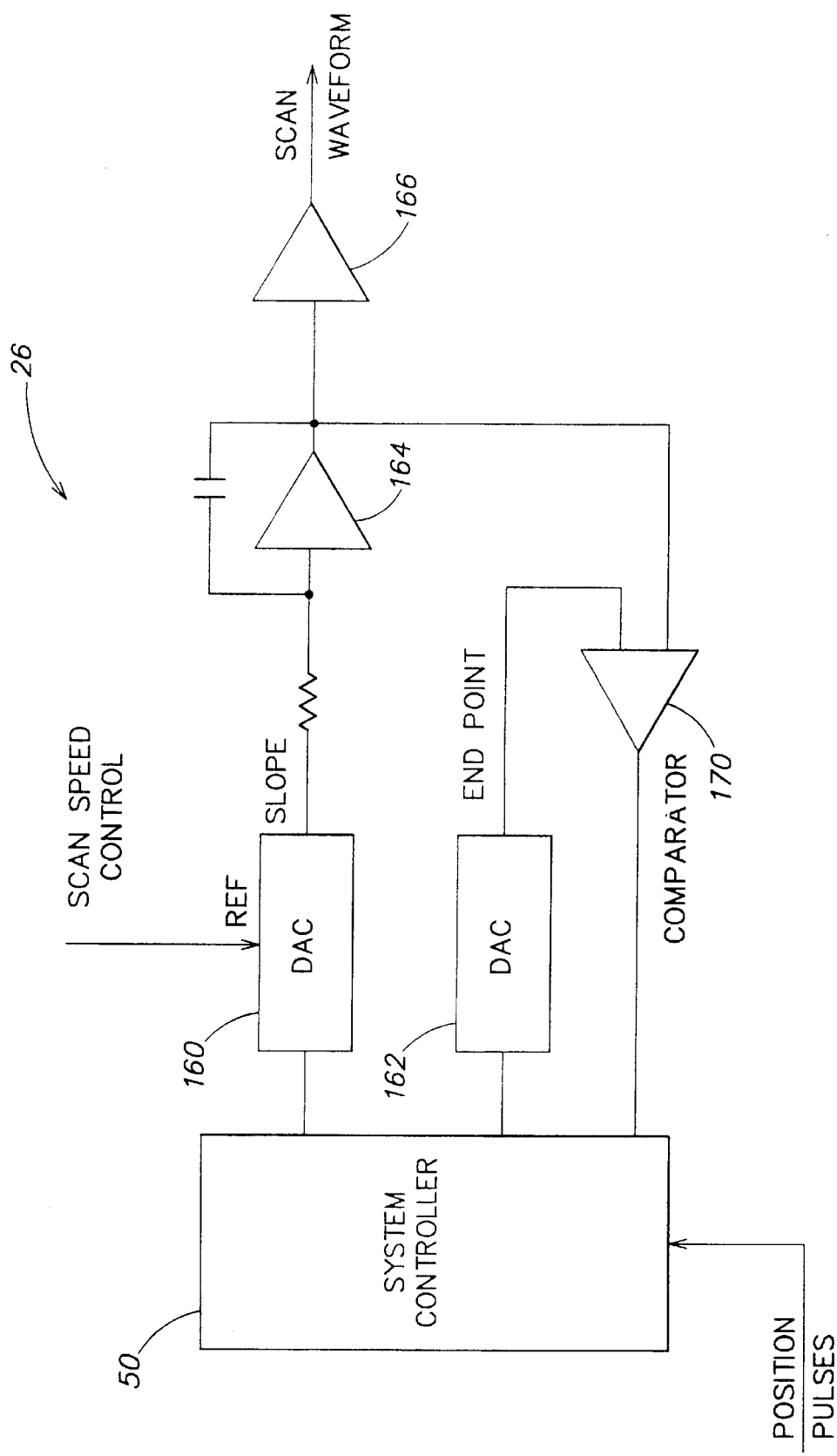
FIG. 6 is a schematic block diagram of a scan generator in accordance with an embodiment of the invention.

An implementation of the scan generator 26 (FIG. 2) is shown in FIG. 6. The system controller 50 controls ion beam scanning. The scan waveform may be a piecewise linear curve, where each segment is defined by a slope and an end point. The data that defines the waveform is stored in a waveform memory in system controller 50. The system controller loads the slope and end point values into digital-to-analog converters (DAC'S) 160 and 162, respectively. The output of digital-to-analog converter 160 drives an integrator 164. The output of integrator 164 and the output of digital-to-analog converter 162 are supplied to inputs of a comparator 170. When the output of integrator 164 reaches the specified end point, the comparator 170 provides a signal to system controller 50. The system controller then outputs a new slope and end point for the next segment of the waveform. The output of integrator 164 is supplied through an amplifier 166 as a scan waveform. The system controller 50 also receives pulses from the mechanical translation system 40 which indicate that the wafer 34 has moved by a distance equal to the desired scan line spacing. The system controller 50 reverses the scan direction by supplying a new slope and end point to digital-to-analog converters 160 and 162, respectively. The system controller 50 also adjusts the timing of the scan reversal to center the waveform on the wafer. The system controller 50 can further slow or stop the scan for a time interval at or near the edges of the wafer to reduce the required overscan, as described above.

While there have been shown and described what are at present considered the preferred embodiments of the present invention, it will be obvious to those skilled in the art that various changes and modifications may be made therein without departing from the scope of the invention as defined by the appended claims.

What is claimed is:

1. A method for ion implantation of a workpiece, comprising the steps of:

generating an ion beam;

scanning the ion beam across a workpiece in a first direction in response to a scan waveform that defines a beam scan width;

translating the workpiece in a second direction at a translation velocity relative to the ion beam so that ion beam is distributed over the workpiece; and controlling the translation velocity and the beam scan width to limit the time that the ion beam is off the workpiece.

2. A method as defined in claim 1 wherein the workpiece comprises a semiconductor wafer and wherein the translation velocity and the beam scan width are controlled to produced a substantially circular scan pattern.

3. A method as defined in claim 2 wherein the translation velocity is controlled to produce a relatively slow translation velocity when the ion beam is near the center of the wafer and to produce a relatively fast translation velocity when the ion beam is near the top and bottom of the wafer.

4. A method as defined in claim 2 wherein the beam scan width is controlled to be an inverse function of the translation velocity.

5. A method as defined in claim 2 wherein the step of controlling the translation velocity and the beam scan width comprises reducing the beam scan width where the translation velocity is relatively high and increasing the beam scan width where the translation velocity is relatively low.

6. A method as defined in claim 2 wherein the step of controlling the translation velocity and the beam scan width comprises reversing the ion beam scan in response to position pulses generated by a mechanical translation system.

7. A method as defined in claim 6 wherein the position pulses are generated by the mechanical translation system each time the wafer is translated in the second direction by a fixed distance.

8. A method as defined in claim 6 wherein the step of reversing the ion beam scan scanning further comprises adjusting timing of the scan reversal so that the scan pattern is centered on the wafer.

9. A method as defined in claim 2 wherein the translation velocity and the beam scan width are controlled to achieve a uniform ion distribution over the surface of the semiconductor wafer.

10. A method as defined in claim 1 wherein the ion beam is scanned off the workpiece to ensure dose uniformity.

11. A method as defined in claim 1 wherein the step of scanning the ion beam further comprises slowing or stopping scanning near the ends of the scan to achieve dose uniformity without scanning the ion beam completely off the wafer.

12. A method as defined in claim 1 wherein the translation velocity and the beam scan width are controlled such that a scan area is not substantially larger than the workpiece.

13. Ion implantation apparatus comprising:
   an ion beam generator for generating an ion beam;
   a scanner for scanning the ion beam across a workpiece in a first direction in response to a scan waveform that defines a beam scan width;
   a mechanical translator for translating the workpiece in a second direction at a translation velocity relative to the ion beam so that the ion beam is distributed over the workpiece; and
   a controller for controlling the translation velocity and the beam scan width to limit the time that the ion beam is off the workpiece.

14. Ion implantation apparatus as defined in claim 13 wherein the workpiece comprises a semiconductor wafer and wherein the translation velocity and the beam scan width are controlled to produce a substantially circular scan pattern.

15. Ion implantation apparatus as defined in claim 14 wherein the controller comprises means for triggering reversal of ion beam scanning in response to position pulses received from the mechanical translator.

16. Ion implantation apparatus as defined in claim 15 wherein the controller comprises means for adjusting timing of the reversal of ion beam scanning so that the scan pattern remains substantially centered on the wafer.

17. Ion implantation apparatus as defined in claim 14 wherein the controller comprises means for slowing or stopping the ion beam scan near the ends of the scan to achieve uniform dose distribution without scanning the ion beam completely off the wafer.

18. Ion implantation apparatus as defined in claim 13 wherein the controller comprises means for producing a relatively narrow beam scan width when the translation velocity is relatively high and for producing a relatively wide beam scan width when the translation velocity is relatively low.

* * * * *